United States Patent [19]

Hayhurst

[11] Patent Number: 5,477,152

[45] Date of Patent: Dec. 19, 1995

[54] DEVICE FOR TESTING CONTINUITY AND/OR SHORT CIRCUITS IN A CABLE

[75] Inventor: Arthur R. Hayhurst, Grafton, Va.

[73] Assignee: The United States of America as represented by the Administrator of the National Aeronautics and Space Administration, Washington, D.C.

[21] Appl. No.: 324,851

[22] Filed: Oct. 14, 1994

Related U.S. Application Data

[63] Continuation of Ser. No. 73,845, Jun. 7, 1993, abandoned.

[51] Int. Cl.$^6$ ................................................ G01R 31/02

[52] U.S. Cl. .................... 324/542; 324/539; 324/556; 324/133

[58] Field of Search ............................ 324/539, 541, 324/542, 555, 556, 133

[56] References Cited

U.S. PATENT DOCUMENTS

| | | | |
|---|---|---|---|
| 2,526,891 | 10/1950 | Meyerhoff et al. | 324/539 |
| 2,810,881 | 10/1957 | Daily | 324/542 |
| 2,814,774 | 11/1957 | Wong | 324/542 |
| 4,227,146 | 10/1980 | Hodge | 324/542 |
| 4,281,283 | 7/1981 | Ross et al. | 324/556 |
| 4,418,312 | 11/1983 | Figler et al. | 324/540 |
| 4,471,293 | 9/1984 | Schnack | 324/540 |
| 4,491,781 | 1/1985 | McClintic | 324/543 |
| 4,533,085 | 11/1985 | Canzano | 324/542 |
| 4,670,709 | 6/1987 | Iredale | 324/542 |
| 5,027,074 | 6/1991 | Haferstat | 324/539 |
| 5,280,251 | 1/1994 | Strangio | 324/539 |

Primary Examiner—Kenneth A. Wieder
Assistant Examiner—Glenn W. Brown
Attorney, Agent, or Firm—George F. Helfrich

[57] ABSTRACT

A device for testing current paths is attachable to a conductor. The device automatically checks the current paths of the conductor for continuity of a center conductor, continuity of a shield and a short circuit between the shield and the center conductor. The device includes a pair of connectors and a circuit to provide for testing of the conductive paths of the cable. The pair of connectors electrically connects the conductive paths of a cable to be tested with the circuit paths of the circuit. The circuit paths in the circuit include indicators to simultaneously indicate the results of the testing.

26 Claims, 2 Drawing Sheets

DEVICE FOR TESTING CONTINUITY AND/OR SHORT CIRCUITS IN A CABLE

ORIGIN OF THE INVENTION

The invention described herein was made by employees of the U.S. Government and may be manufactured and used by or for the U.S. Government without the payment of any royalties thereon or therefor. This is a continuation of application Ser. No. 08/073,845 filed on Jun. 7, 1993 now abandoned.

BACKGROUND OF THE INVENTION

1. Field of the Invention

This invention relates to devices for testing cables and, more particularly, relates to devices for automatically testing the continuity of center conductors and shields of a cable and for short circuits therebetween.

2. Description of Related Art

Conductors, such as cables and the like need to be checked for damage which is often not apparent to the naked eye. Typically, this is done by electrically testing a cable for continuity and short circuits. However, many known testing techniques are time consuming and tedious. Known techniques include, for example, manually probing the center conductor and shield of the cable. Although some cable testers indicate a fault in the cable, many do not distinguish between an open circuit in the center conductor and one in the shield. Other cable testers require the use of switches to determine whether the conductor or shield is faulty.

These known testing techniques are problematic because they are subject to human error. In addition, they can be very tedious especially when a vast number of cables have to be tested.

U.S. Pat. No. 4,670,709 to Iredale discloses a battery-powered audio cable test device which can test several different types of audio cable for shorts or opens when operated in a cable continuity mode. This device does not test center conductors and shields for continuity. Additionally, even when three prong cables are tested, the device does not specify which conductor is faulty, only that the cable is faulty.

U.S. Pat. No. 4,491,781 to McClintic discloses a battery-powered tester unit for determining if a short or a break exists in either of two conductive paths in a cable. The tester includes a pair of jacks adapted to receive plugs of a cable and a pair of indicating LEDs. Each of two contacts of the first jack is connected in series with an LED, the battery and the corresponding contact of the second jack so as to create a circuit that tests continuity in both of the conductors in a cable with both of its plugs connected to the tester. This device requires that a cable be tested separately for short circuits, and then for continuity. Accordingly, excessive time may be required to fully test a cable. Additionally, it is easy to forget to perform one of the two tests, especially when many cables are being tested.

U.S. Pat. No. 4,281,283 to Ross et al. discloses a portable battery-powered audio cable tester having two jacks for connecting a cable to be tested. A signal light and a push-button "short" switch are connected with a battery such that the light will switch on when a cable not having a "short" is connected to the tester and off when the short switch is opened, indicating the absence of a short. However, a position toggle switch must be actuated along with the push button "short" switch to distinguish between malfunctions due to a broken conductor, an open shield, or a short circuit.

U.S. Pat. No. 4,553,085 to Canzano discloses a coaxial cable tester device having a transmitter unit and a receiver unit, each with two coaxial connectors. The cable tester device determines whether a cable is defective, whether the defect is an open circuit or a short circuit and in which cable conductor the defect occurs. This system is bulky and also requires the manipulation of a switch and multiple cable connection sequences in order to test for conductor and shield continuity, and for a short circuit.

SUMMARY OF THE INVENTION

It is an object of the invention to provide a device to simultaneously test a plurality of circuit paths of a cable for continuity and for short circuits therebetween, and to provide the user with an indication of the operational condition of the tested circuit paths.

It is another object of the invention to provide a device which is compatible with many types of cables to be tested.

It is a further object of the invention to provide a cable test device which can also be used to test other conductors or components for continuity.

The present invention accomplishes the foregoing and other objects by providing a device which automatically tests cables upon electrical coupling of the device and a cable. The device is electrically coupled via connectors to the ends of the cable. At least three different types of connector pairs may be provided so as to accommodate varying cable ends. The connectors provide for an electrical contact with the conductive paths of the cable. The connectors are coupled to a circuit. The circuit automatically tests conductive paths of an electrically coupled cable. The circuit detects whether the conductive paths are open and whether there is a short between two conductive paths of the cable. The circuit includes indicating devices to simultaneously indicate whether each conductive path is open and whether there is a short circuit between the conductive paths of the cable.

The device can include a switch electrically connected to the circuit so that equipment in addition to cables can be tested with the device.

BRIEF DESCRIPTION OF THE DRAWINGS

The invention will be described with reference to the following drawings in which like reference numbers refer to like elements, and wherein.

DETAILED DESCRIPTION OF PREFERRED EMBODIMENTS

Figure 1:
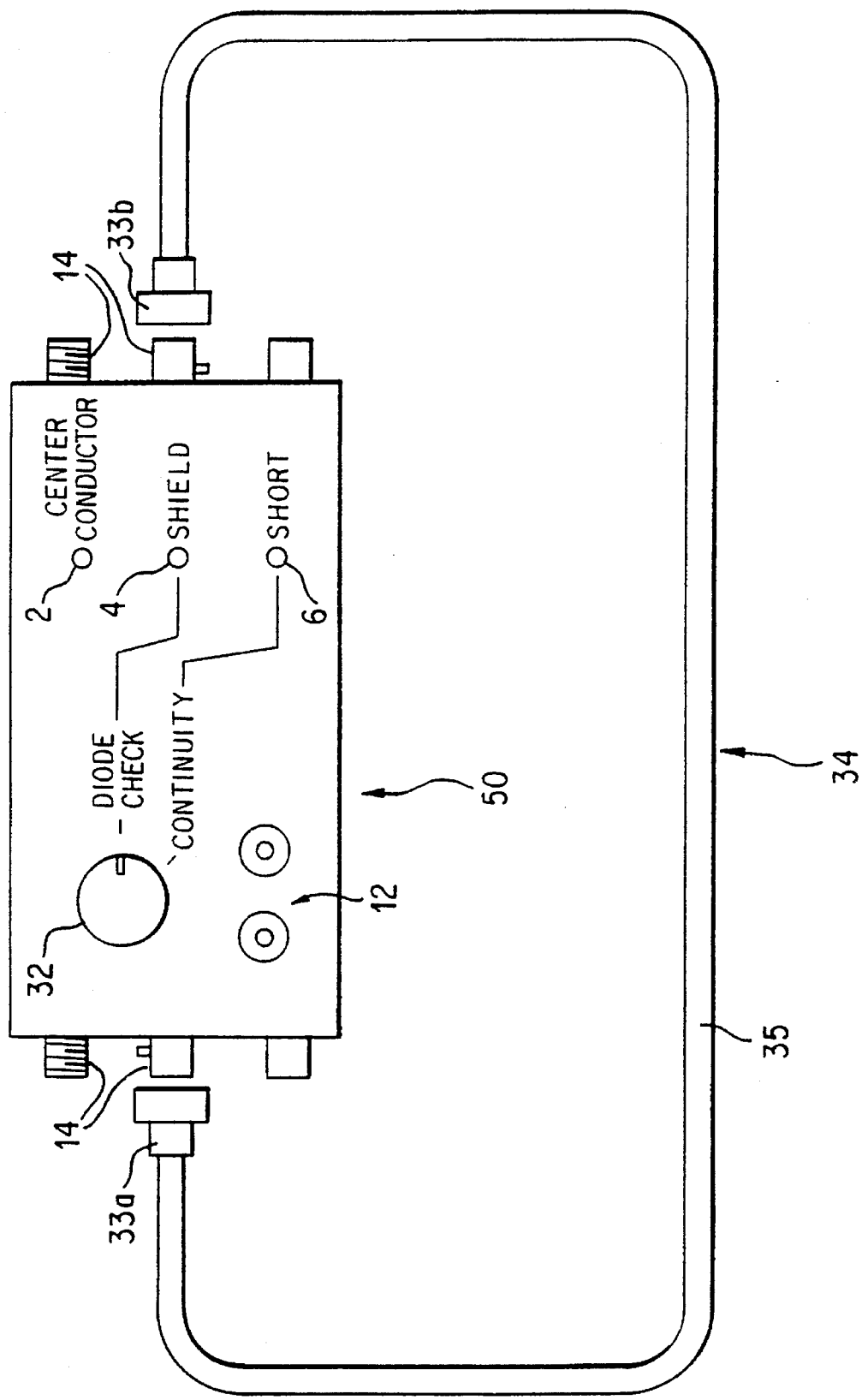
FIG. 1 is a top view of a cable tester in accordance with one preferred embodiment of the invention.

FIG. 1 is a top view of a cable tester 50 in accordance with an illustrative embodiment of the invention. At least one pair of connectors 14 is provided for electrically coupling a cable 34 to tester 50. Preferably, a plurality of different types of connectors 14 are provided so that tester 50 can be used to test different types of cables. The tester 50 in FIG. 1 includes three pairs of connectors 14. The three different types of connectors can be, for example, a BNC (bayonet null connector), a phono plug and an F-type connector. However, other types of connectors could be provided. Each connector pair can be comprised of two female connectors, two male connectors, or one female and one male connector.

Figure 2:
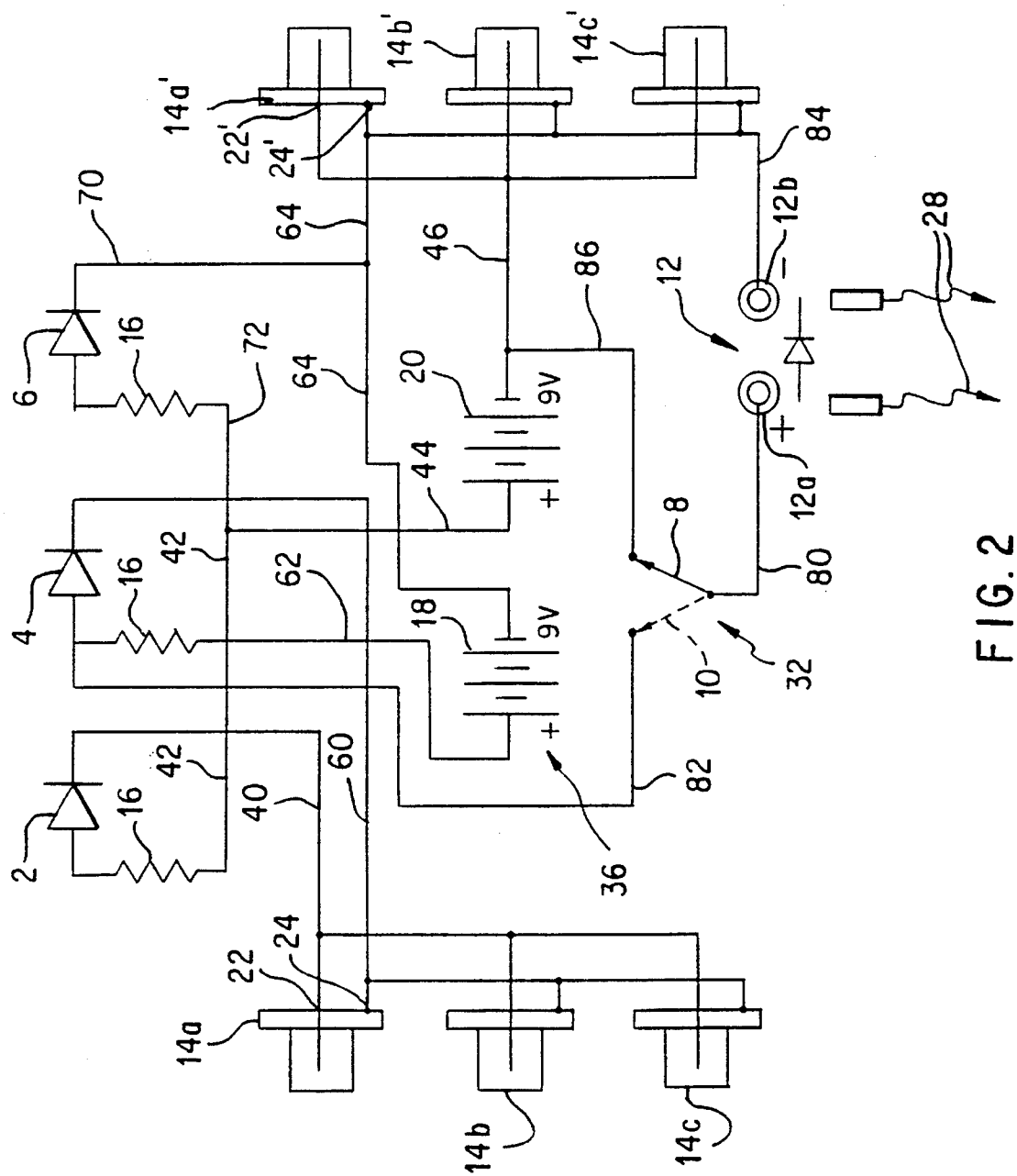
FIG. 2 is a schematic circuit diagram of the FIG. 1 cable tester.

Referring to FIG. 2, a first connector pair 14a, 14a', a second connector pair 14b, 14b', and a third connector pair 14c, 14c' are provided. As discussed above, each cable 34 includes a center conductor and a shield which need to be tested for continuity. It is also desirable to test for short circuits between the center conductor and the shield which can be located, for example, within the wire portion 35 or within the plugs 33a, 33b of cable 34. One pair of connectors connects current paths of tester 50 with the respective center conductor and shield of a cable 34 to be tested. In accordance with a preferred embodiment of the invention, in which two conductive elements (i.e., center conductor and shield) of a cable are tested, each connector 14 has two contacts 22 and 24. Contact 22 is electrically coupled to the center conductor of cable 34 when cable 34 is attached to a connector 14. Contact 24 is electrically coupled to the shield of the cable 34 being tested.

Tester 50 includes power source 36. In accordance with a preferred embodiment of the invention, power source 36 includes two batteries 18 and 20 which are, for example, 9 V batteries. Batteries 18 and 20 are capable of supplying current simultaneously to a plurality of current paths within tester 50.

In accordance with the present invention, the continuity of the center conductor and of the shield, and the presence of short circuits therebetween are simultaneously detected and indicated by tester 50. Accordingly, three separate indicators are provided. In the preferred embodiment, the three separate indicators are light emitting diodes (LEDs) 2, 4, 6. However, it is possible to use indicators other than separate LEDs to indicate the results of the tests performed by tester 50. For example, a buzzer system capable of producing three distinguishable tones could also be provided. Similarly, a visually detectable indicator system other than three separate lights could also be employed. The main requirement is that the indicator be capable of separately indicating the results of at least three different tests, preferably simultaneously.

It is preferable to provide a resistor 16 for each LED 2, 4, 6 to control the LED current. For example, 470 Ohm resistors could be used.

The conductors within tester 50 establish current paths with the center conductor and shield of cable 34 so that, when plugs 33a, 33b of cable 34 are attached to an appropriate pair of connectors 14:

(a) LED 2 lights to indicate that the center conductor of cable 34 has continuity (i.e., is not open);

(b) LED 4 lights to indicate that the shield of cable 34 has continuity; and (c) LED 6 only lights if there is a short circuit between the center conductor and the shield of cable 34.

The current flow paths for each LED 2, 4, 6 in the cable test mode are as follows. In order to test the center conductor of cable 34, current flows from contact 22 of connector 14a, 14b, or 14c (depending on which connector the cable is connected) through path 40, LED 2, path 42, path 44, battery 20, path 46, contact 22' of connector 14a', 14b' or 14c', and the center conductor of cable 34. Unless there is a discontinuity in the center conductor, LED 2 will light. In order to test the shield of cable 34, current flows from contact 24, path 60, LED 4, path 62, battery 18, path 64, contact 24', and the shield of cable 34. Unless there is a discontinuity in the shield, LED 4 will light. When there is a short circuit between the center conductor and shield of cable 34, current flows from contact 22', path 46, battery 20, path 44, path 72, LED 6, path 70, path 64, contact 24', and between the center conductor and the shield of cable 34. Accordingly, LED 6 only lights when there is a short circuit.

Cables having no defects or damage can easily be recognized when both plugs of the cable are attached to the appropriate connector 14 of tester 50 because only LEDs 2 and 4 should be lighted. If either of LEDs 2 or 4 do not light, or if LED 6 does light, the precise defect in cable 34 will be known. This permits the cable to be repaired more easily. Additionally, no switches or buttons need to be activated. Accordingly, the potential for operator error is decreased.

In accordance with a further preferred embodiment of the invention, tester 50 is also operable in a diode check mode and in a continuity mode Switch 32 is provided on tester 50 to switch between these two modes. Switch 32 can be any standard switch available, for example, a toggle switch. In accordance with a preferred embodiment of the invention, switch 32 has at least two positions 8 and 10. When switch 32 is in position 10, the diode check mode is selected. When in the diode check mode, a current path is formed through contact 12a (of a connector 12 which can be, for example, a banana connector), path 80, path 82, path 62, battery 18, path 64, path 84 and contact 12b. Accordingly, when a diode to be tested is plugged into connector 12, the test diode should light. Additionally, the polarization of the test diode can be checked. The tested diode can then be used, for example, as one of the LEDs 2, 4, 6 in tester 50. This avoids the installation of LEDs in tester 50 that may be defective or polarized incorrectly.

Connectors other than banana connector 12 could be provided to test other types of lights, indicators or devices.

When switch 32 is in position 8, the continuity mode is selected. When in the continuity mode, a current path is formed through contact 12a, path 80, path 86, battery 20, path 44, path 72, LED 6, path 70, path 64, path 84 and contact 12b. A pair of probes 28 can be plugged into connector 12 to make electrical contact with respective contacts 12a, 12b. Probes 28 can then be used to test various items, paths, conductors, etc. for electrical continuity therethrough. If a circuit is completed between the tips of probes 28, LED 6 will light.

The provision of the diode check and continuity modes increases the versatility of tester 50, enabling a user thereof to carry less test equipment when checking electrical systems.

Tester 50 is capable of testing cables regardless of the position of switch 32. Thus, switch 32 only needs to be a two position switch. However, it is possible to provide a third position, between 8 and 10, for cable testing.

Although the illustrated embodiment tests cables having a center conductor and a shield, the present invention is applicable to any situation where two or more conductive elements (wires, shields, etc.) are provided in a cable.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

I claim:

1. A device for testing cables having at least first and second conductive paths, the device comprising:

connector means for electrically coupling the device to ends of a cable to be tested so as to make electrical contact with the first and second conductive paths at each end of the cable; including a plurality of connector pairs, each connector in a pair having a first contact for electrical connection with the first conductive path and a second contact for electrical connection with the second conductive path;

circuit means, electrically coupled to the connector means, for detecting whether the first conductive path is open, whether the second conductive path is open, and whether there is a short circuit between the first and second conductive paths of the cable; and the circuit means includes first, second, and third circuit paths; the first circuit path is connected to the first conductive path of the cable through the connector means and includes a first power source, or a first power source connection, and a first indicator means; the second circuit path is connected to the second conductive path of the cable through the connector means and includes a second power source, or a second power source connection, and a second indicator means; the third circuit path is connected to the first and the second circuit paths, utilizes the second power source or the second power source connection, and includes a third indicator means; and said first, second and third indicator means, included in the plurality of circuit paths, for simultaneously indicating whether the first conductive path is open, whether the second conductive path is open, and whether there is a short circuit between the first and second conductive paths of the cable.

2. The device of claim 1, wherein the power sources include first and second batteries, the first battery included in the first circuit path, the second battery included in both the second and third circuit paths.

3. The device of claim 1, wherein the indicators are light emitting diodes.

4. The device of claim 1, wherein the first conductive path of the cable to be tested is a center conductor, and the second conductive path of the cable to be tested is a shield which surrounds the center conductor.

5. The device of claim 1, further comprising an auxiliary connector electrically connected to the circuit so that equipment in addition to cables can be tested with the device.

6. The device of claim 5, further comprising a switch electrically connected to the circuit and operative to place the device in a first auxiliary test mode in which the auxiliary connector is placed in a common circuit path with the third indicator means so that the device can be used to test equipment and to indicate whether the equipment is operative with the third indicator means.

7. The device of claim 6, wherein the switch is also operative to place the device in a second auxiliary test mode in which the auxiliary connector is not placed in a common circuit path with the third indicator means but in which current is supplied to the auxiliary connector from the second power source so that the device can be used to test equipment.

8. The device of claim 7, wherein the device is operative to test cables using the connector means regardless of the mode in which the switch places the device.

9. The device of claim 1, wherein the connector means includes a plurality of different connector pairs so that a plurality of different types of cables can be tested with the device.

10. The device of claim 9, wherein three different types of connector pairs are provided.

11. The device of claim 10, wherein the three different types of connector pairs include: a bayonet null connector pair, a phono plug connector pair, and an F-type connector pair.

12. A device for testing cables having at least first and second conductive paths, the device comprising:

connector means for electrically coupling the device to ends of a cable to be tested so as to make electrical contact with the first and second conductive paths at each end of the cable, including a plurality of connector pairs, each connector in a pair having a first contact for electrical connection with the first conductive path and a second contact for electrical connection with the second conductive path;

circuit means, electrically coupled to the connector means, for detecting whether the first conductive path is open, whether the second conductive path is open, and whether there is a short circuit between the first and second conductive paths of the cable; the circuit means includes first, second, and third circuit paths; the first circuit path is connected to the first conductive path of the cable through the connector means and includes a first power source, or a first power source connection, and a first indicator means; the second circuit path is connected to the second conductive path of the cable through the connector means and includes a second power source, or a second power source connection, and a second indicator means; the third circuit path is connected to the first and the second circuit paths, utilizes the second power source or the second power source connection, and includes a third indicator means;

said first, second and third indicator means, included in the plurality of circuit paths, for simultaneously indicating whether the first conductive path is open, whether the second conductive path is open, and whether there is a short circuit between the first and second conductive paths of the cable; and an auxiliary connector electrically connected to the circuit so that equipment in addition to cables can be tested with the device by supplying power to the equipment with the second power source.

13. The device of claim 12, wherein the first conductive path of the cable to be tested is a center conductor, and the second conductive path of the cable to be tested is a shield which surrounds the center conductor.

14. The device of claim 12, further comprising a switch electrically connected to the circuit and operative to place the device in a first auxiliary test mode in which the auxiliary connector is placed in a common circuit path with the third indicator means so that the device can be used to test equipment and to indicate whether the equipment is operative with the third indicator means.

15. The device of claim 14, wherein the switch is also operative to place the device in a second auxiliary test mode in which the auxiliary connector is not placed in a common circuit path with the third indicator means but in which current is supplied to the auxiliary connector from the second power source so that the device can be used to test equipment.

16. The device of claim 15, wherein the device is operative to test cables using the connector means regardless of the mode in which the switch places the device.

17. The device of claim 12, wherein the auxiliary connector is a banana connector.

18. A device for testing cables having at least first and second conductive paths, the device comprising:

connector means for electrically coupling the device to ends of a cable to be tested so as to make electrical contact with the first and second conductive paths at each end of the cable, including a plurality of connector pairs, each connector in a pair having a first contact for electrical connection with the first conductive path and a second contact for electrical connection with the second conductive path, and where the first conductive path of the cable to be tested is a center conductor, and the second conductive path of the cable to be tested is a shield which surrounds the center conductor;

circuit means, electrically coupled to the connector means, for detecting whether the first conductive path is open, whether the second conductive path is open, and whether there is a short circuit between the first and second conductive paths of the cable; and the circuit means includes first, second, and third circuit paths; and the first circuit path is connected to the first conductive path of the cable through the connector means and includes a first power source, or a first power source connection, and a first indicator means; and the second circuit path is connected to the second conductive path of the cable through the connector means and includes a second power source, or a second power source connection, and a second indicator means; and the third circuit path is connected to the first and the second circuit paths, utilizes the second power source or the second power source connection, and includes a third indicator means; and said first, second and third indicator means, included in the plurality of circuit paths, for simultaneously indicating whether the first conductive path is open, whether the second conductive path is open, and whether there is a short circuit between the first and the second conductive paths of the cable.

19. The device of claim 18, wherein the power source includes first and second batteries, the first battery included in the first circuit path, the second battery included in both the second and third circuit paths.

20. The device of claim 18, wherein the connector means includes a plurality of different connector pairs so that a plurality of different types of cables can be tested with the device.

21. The device of claim 20, wherein three different types of connector pairs are provided.

22. The device of claim 21, wherein the three different types of connector pairs include: a bayonet null connector pair, a phono plug connector pair, and an F-type connector pair.

23. The device of claim 18, further comprising an auxiliary connector electrically connected to the circuit so that equipment in addition to cables can be tested with the device.

24. The device of claim 23, further comprising a switch electrically connected to the circuit and operative to place the device in a first auxiliary test mode in which the auxiliary connector is placed in a common circuit path with the third indicator so that the device can be used to test equipment and to indicate whether the equipment is operative with the third indicator.

25. The device of claim 24, wherein the switch is also operative to place the device in a second auxiliary test mode in which the auxiliary connector is not placed in a common circuit path with the third indicator but in which current is supplied to the auxiliary connector from the second power source so that the device can be used to test equipment.

26. The device of claim 18, wherein the indicator means includes three separate indicators, and the indicators are light emitting diodes.

* * * * *